(12) United States Patent
Ramirez et al.

(10) Patent No.: US 12,222,544 B2
(45) Date of Patent: Feb. 11, 2025

(54) PHOTONIC CHIP

(71) Applicant: Commissariat à l'Energie Atomique et aux Energies Alternatives, Paris (FR)

(72) Inventors: Joan Ramirez, Palaiseau (FR); David Bitauld, Palaiseau (FR); Karim Hassan, Grenoble (FR); Bertrand Szelag, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 250 days.

(21) Appl. No.: 17/952,498

(22) Filed: Sep. 26, 2022

(65) Prior Publication Data

US 2023/0105346 A1 Apr. 6, 2023

(30) Foreign Application Priority Data

Oct. 5, 2021 (FR) ..................... 21 10550

(51) Int. Cl.
*G02B 6/12* (2006.01)
*G02B 6/122* (2006.01)
(Continued)

(52) U.S. Cl.
CPC ....... *G02B 6/1228* (2013.01); *G02B 6/12004* (2013.01); *G02B 6/136* (2013.01);
(Continued)

(58) Field of Classification Search
CPC ............ G02B 6/12002; G02B 6/12004; G02B 6/1228; G02B 6/136; G02B 2006/12061;
(Continued)

(56) References Cited

U.S. PATENT DOCUMENTS 8,853,812 B2 * 10/2014 Okamoto .............. H01L 31/105
438/69
9,871,343 B2 * 1/2018 Menezo .............. H01S 5/02325
(Continued)

FOREIGN PATENT DOCUMENTS

EP 2 650 710 A2 10/2013

OTHER PUBLICATIONS

Preliminary French Search Report issued May 5, 2022 in French Application 21 10550 filed on Oct. 5, 2021, 9 pages (with English Translation of Categories of Cited Documents & Written Opinion).
(Continued)

*Primary Examiner* — Ryan A Lepisto
(74) *Attorney, Agent, or Firm* — Oblon, McClelland, Maier & Neustadt, L.L.P.

(57) ABSTRACT

A photonic chip including an optical coupler capable of transferring an optical signal between a first waveguide made of III-V material and a second waveguide made of silicon, this optical coupler including a first extension made of III-V material which extends the core of the first waveguide, a second extension made of silicon which extends the core of the second waveguide, and a SiGe inclusion buried inside of the second extension, this inclusion being made of SiGe whose chemical formula is $Si_{1-x}Ge_x$, where x is in the range between 0.2 and 0.5, and being optically coupled, on a first side, to the first waveguide and, on a second opposite side, to the second waveguide.

11 Claims, 4 Drawing Sheets

(51) Int. Cl.
*G02B 6/126* (2006.01)
*G02B 6/136* (2006.01)
*H01S 5/026* (2006.01)

(52) U.S. Cl.
CPC .......... *H01S 5/026* (2013.01); *G02B 6/12002* (2013.01); *G02B 2006/12061* (2013.01); *G02B 2006/12078* (2013.01); *G02B 2006/12121* (2013.01); *G02B 2006/12142* (2013.01); *G02B 2006/12147* (2013.01)

(58) Field of Classification Search
CPC .......... G02B 2006/12078; G02B 2006/12121; G02B 2006/12142; G02B 2006/12147; H01S 5/026
See application file for complete search history.

(56) References Cited

U.S. PATENT DOCUMENTS

| | | | | |
|---|---|---|---|---|
| 10,262,984 | B1* | 4/2019 | Maggi | G02B 6/12002 |
| 10,436,982 | B1* | 10/2019 | Bian | G02B 6/13 |
| 10,690,853 | B2* | 6/2020 | Li | H03F 3/08 |
| 10,705,354 | B2* | 7/2020 | Menezo | G02F 1/025 |
| 10,725,324 | B2* | 7/2020 | Hassan | G02F 1/025 |
| 11,385,484 | B2* | 7/2022 | Hassan | H01S 5/125 |
| 2010/0040327 | A1* | 2/2010 | Deki | G02B 6/305 |
| | | | | 385/28 |
| 2013/0272646 | A1 | 10/2013 | Fish et al. | |
| 2014/0307997 | A1* | 10/2014 | Bar | H01L 29/205 |
| | | | | 438/107 |
| 2018/0059329 | A1 | 3/2018 | Boutami et al. | |
| 2018/0088290 | A1 | 3/2018 | Fish et al. | |
| 2018/0259710 | A1* | 9/2018 | Stabile | G02B 6/305 |

OTHER PUBLICATIONS

Lamponi et al., "Low-Threshold Heterogeneously Integrated InP/SOI Lasers With a Double Adiabatic Taper Coupler", IEEE Photonics Technology Letters, vol. 24, No. 1, 2012, 3 pages.

Ramirez et al., "III-V-on-Silicon Integration: From Hybrid Devices to Heterogeneous Photonic Integrated Circuits", IEEE Journal of Selected Topics in Quantum Electronics, 2019, 13 pages.

Kopp et al., "Mature 25Gb/s Silicon Photonic Platform towards Multi-Layer Circuits for High Integration Level Applications", Proceedings of the 5$^{th}$ International Conference on Photonics, Optics and Laser Technology, 2017, 6 pages.

Ben Bakir et al., "Hybrid Si/II-V lasers with adiabatic coupling", 8$^{th}$ IEEE International Conference on Group IV Photonics, 2011, 3 pages.

Ben Bakir et al., "Heterogeneously Integrated III-V on Silicon Lasers", ECS Transactions, 64 (5), 2014, 13 pages.

Yariv et al., "Supermode Si/III-V hybrid lasers, optical amplifiers and modulators: A proposal and analysis", Optics Express, vol. 15, No. 15, 2007, 5 pages.

Cho et al., "Effects of germanium incorporation on optical performances of silicon germanium passive devices for group-IV photonic integrated circuits", Photonics and Nanostructures—Fundamentals and Applications 12, 2014, 15 pages.

* cited by examiner

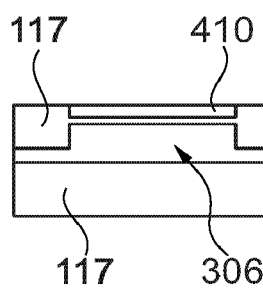
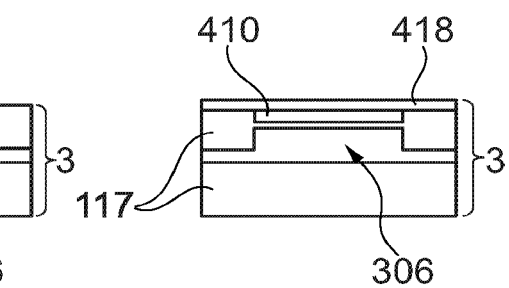
Fig. 9    Fig. 10
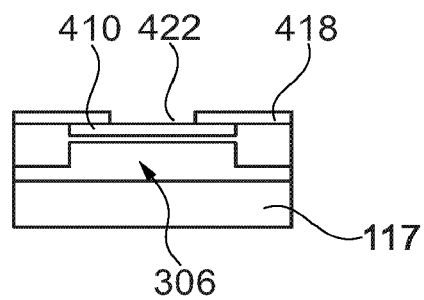
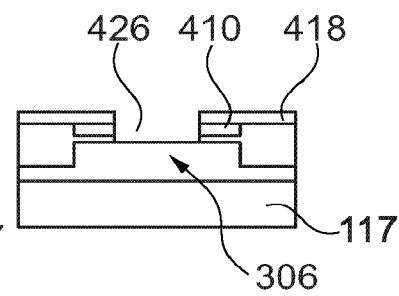
Fig. 11    Fig. 12
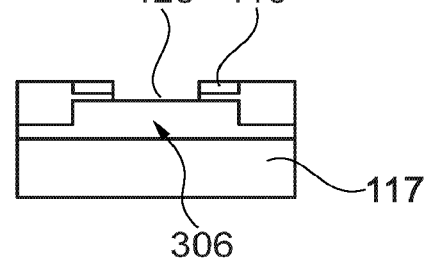
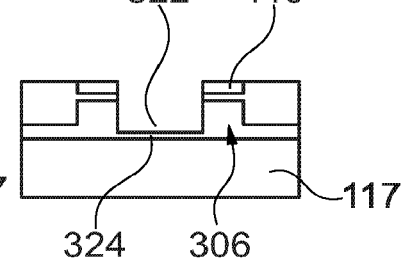
Fig. 13    Fig. 14
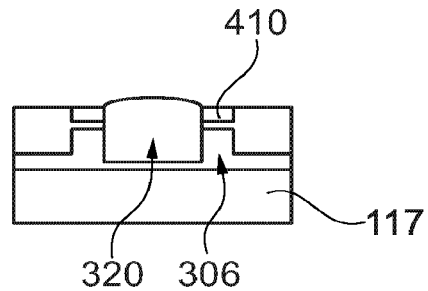
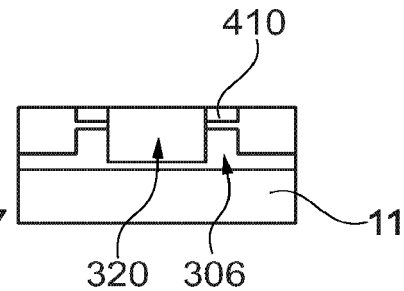
Fig. 15    Fig. 16

PHOTONIC CHIP

The invention relates to a photonic chip and a method of fabrication of this photonic chip.

Known photonic chips comprise a semiconductor laser source capable of generating an optical signal. Such a laser source comprises a waveguide made of a III-V gain material optically coupled, by means of an optical coupler, to a waveguide made of silicon. Such an optical coupler comprises, facing one another:
- a first extension made of III-V material which extends the core of the waveguide made of III-V gain material into an optical coupling region, and
- a second extension made of silicon which extends the core of the silicon waveguide into the optical coupling region.

In order to obtain an optical coupling between these two extensions, a region of the second extension must have an effective propagation index equal to that of the first extension facing it. For the same dimensions, the effective propagation index of silicon is much lower than the effective propagation index of the III-V material. Accordingly, in order to obtain equality between the effective propagation indices of the opposing regions made of silicon and of III-V material, the dimensions of the region made of silicon must be larger. This increases the size of the optical coupler and, in particular, the thickness of the silicon extension.

Furthermore, photonic chips are often fabricated using an SOI (Silicon-On-Insulator) substrate. The thickness of the layer of single-crystal silicon of such a substrate SOI is fixed in advance. Currently, this thickness is commonly less than or equal to 350 nm. This thickness is less than that desired for the silicon extension of the optical coupler which makes this optical coupler more difficult to fabricate using such an SOI substrate because its fabrication requires the deposition of an extra thickness of single-crystal silicon in order to reach locally a thickness greater than 350 nm. For example, this solution is disclosed in the application US20210149228.

Furthermore, the following are known from the prior art:
- LAMPONI M and AL: "Low-Threshold Heterogeneously Integrated InP/SOI Lasers with a Double Adiabatic Taper Coupler", IEEE Photonics Technology Letters, Vol. 24, n° 1.1, Jan. 1, 2012, pages 76-78;
- US2018059329A1;
- US2018259710A1;
- EP2650710A2.

The invention aims to provide a photonic chip in which the size of the optical coupler between a silicon waveguide and a waveguide made of III-V material is reduced.

Another subject of the invention is a method of fabrication of this photonic chip.

The invention will be better understood upon reading the description that follows, given solely by way of non-limiting example and presented with reference to the drawings in which:

FIGS. 9 to 16 are schematic illustrations, in vertical cross-section, of various states of fabrication of the optical coupler of FIG. 2 obtained during the implementation of the method in FIG. 8.

In these figures, the same references are used to denote the same elements. In the following part of this description, the features and functions well known to those skilled in the art are not described in detail.

In the following, the definitions of certain terms and expressions used in this request are given in a Chapter I. Subsequently, detailed examples of embodiments are described in a Chapter II with reference to the figures. In the following Chapter III, variants of these embodiments are presented. Finally, the advantages of the various embodiments are presented in a Chapter IV.

Chapter I: Terminology and Definitions

In this description, when it is indicated that a waveguide is made of a material X, this means that the core of this waveguide is made of this material X. The cladding of this waveguide is made of another material with a lower index of refraction.

When it is indicated that an element "is made of a material X", this means that the material X represents more than 90% or 95% or 98% of the mass of this element.

The effective propagation index $n_{eff}$ is also known by the term "phase constant of the mode". It is defined by the following relation: $n_g = n_{eff} - \lambda dn_{eff}/d\lambda$, where $n_g$ is the group index and $\lambda$ is the wavelength of the optical signal guided by the guide. The effective propagation index of a waveguide depends on the dimensions of the core of this waveguide and on the materials forming this core and the cladding of this waveguide. It may be determined experimentally or by computer simulation.

The cladding of a waveguide is generally made of a dielectric material. In this case, the dielectric material is a dielectric material whose index $n_{md}$ of refraction is lower than the index $n_{si}$ if the core of the waveguide is made of silicon and lower than the index $n_{III-V}$ if the core is made of III-V material, where $n_{si}$ and are the indices of refraction, respectively, of silicon and of the III-V material. Typically, the index $n_{md}$ is lower than or equal to 0.85 $n_c$ or lower than or equal to 0.75 $n_c$, where $n_c$ is the index of refraction of the core of the waveguide.

The width of an element here denotes the width of this element measured in a horizontal direction perpendicular to the direction of propagation of the optical signal in this element.

A transverse cross-section of an element is a cross-section perpendicular to the direction of propagation of the optical signal in this element.

Chapter II: Examples of Embodiments

Figure 1:
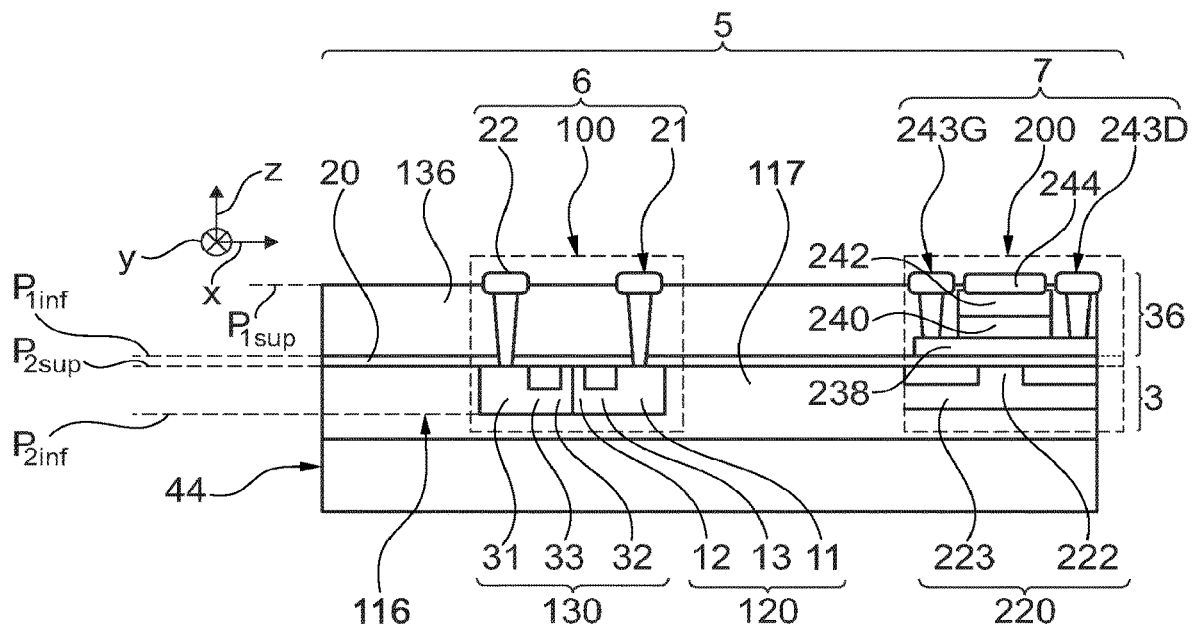
FIG. 1 is a schematic illustration of a photonic chip in vertical cross-section.

FIG. 1 shows a photonic chip 5. In this particular embodiment, the photonic chip 5 is a transmitter of an optical signal modulated in phase and/or in amplitude for transmitting bits of information to a receiver via an optical fibre. For this purpose, the chip 5 comprises a laser source 7 which emits an optical signal whose phase and/or amplitude is subsequently modulated by a system 6 for phase and/or amplitude modulation of this optical signal. For example, the wavelength $\lambda_{Li}$ of the optical signal emitted by the laser source 7 is in the range between 1240 nm and 1630 nm. Here, the wavelength $\lambda_{Li}$ is equal to 1550 nm.

FIG. 1 shows the elements of the chip 5 in cross-section in a vertical plane parallel to the directions X and Z.

In FIG. 1 and the subsequent figures, the horizontal is represented by directions X and Y of an orthogonal reference frame. The direction Z of this orthogonal reference frame represents the vertical direction. In the following, the terms such as "upper", "lower", "above", "below", "high" and "low" are defined with respect to this direction Z. The terms "left" and "right" are defined with respect to the direction X. The terms "front" and "back" are defined with respect to the direction Y.

In the following, the term "thickness" denotes the maximum thickness of an element in the direction Z.

The system 6 may be a system for modulating the phase alone, the amplitude alone or simultaneously both the phase and the amplitude.

In order to modulate the phase or the amplitude of the optical signal, the system 6 comprises at least one phase modulator and, often, at least one phase matching device. For example, the system 6 is a Mach-Zehnder interferometer in which the modulator and the phase matching device are arranged in one of the branches of this interferometer for modulating the amplitude and/or the phase of the optical signal generated by the laser source 7. The structures of a Mach-Zehnder interferometer and of a phase matching device are well known and are not described here in detail. The phase matching device is for example the same as that described in the application US2017237229A1. Accordingly, in order to simplify FIG. 1, only a phase modulator 100 is shown.

The modulator 100 allows the phase of the optical signal to be rapidly modified. For this purpose, here the modulator 100 is a modulator with a PN (Positive-Negative) junction. It therefore comprises two electrodes 120 and 130.

The electrodes 120 and 130 are made of doped single-crystal silicon. In this embodiment, they are entirely structured in the single-crystal silicon of a layer 3.

The layer 3 comprises single-crystal silicon encapsulated in a dielectric material 117. Generally speaking, a dielectric material has an electrical conductivity at 20° C. of less than $10^{-7}$ S/m and, preferably, less than $10^{-9}$ S/m or $10^{-15}$ S/m. In addition, in the case of the dielectric material 117, its index of refraction is strictly less than the index of refraction of silicon. For example, in this embodiment, the dielectric material 117 is silicon dioxide ($SiO_2$). The layer 3 extends mainly in a horizontal plane. The layer 3 is situated directly on a rigid substrate 44.

The substrate 44 extends mainly in a horizontal plane called "plane of the substrate". In this exemplary embodiment, the substrate 44 is a wafer whose thickness is typically greater than 200 μm or 400 μm. For example, the substrate 44 is a wafer made of silicon of 725 μm.

In the layer 3, the single-crystal silicon extends vertically from a lower horizontal plane $P2_{inf}$ up to an upper horizontal plane $P_{2sup}$. The plane $P_{2sup}$ is situated at the interface between the layer 3 and a layer 20 of dielectric material situated directly above the layer 3. The plane $P_{2inf}$ is situated above the interface between the layer 3 and the substrate 44. Thus, the single-crystal silicon of the layer 3 is also isolated mechanically and electrically from the substrate 44 by the dielectric material 117. For example, the thickness of single-crystal silicon in the layer 3 is in the range between 100 nm and 400 nm. Conventionally, the thickness of single-crystal silicon is equal to 220 nm or 280 nm or 310 nm. In this example, the thickness of the single-crystal silicon in the layer 3 is equal to 310 nm.

The electrode 120 extends, in the direction X, from a proximal end 12 to a distal end 11. It also extends in the direction Y. The electrode 120 is doped. Typically, the concentration of dopant in the electrode 120 is in the range between $10^{17}$ and $10^{21}$ atoms/$cm^3$.

The thickness $e_{12}$ of the proximal end 12 is equal to the thickness of the single-crystal silicon encapsulated in the layer 3. This thickness $e_{12}$ is therefore equal to 310 nm. The thickness $e_{11}$ of the distal end here is equal to the thickness $e_{12}$.

The electrode 120 also comprises a bridge 13 made of doped single-crystal silicon which mechanically and electrically connects the ends 11 and 12. Here, the thickness $e_{13}$ of this bridge is less than the thickness $e_{12}$.

The electrode 130 is also made of doped single-crystal silicon with a doping of sign opposite to that of the electrode 120. The concentration of dopant of the electrode 130 is, for example, in the range between $10^{17}$ atoms/$cm^3$ and $2 \times 10^{19}$ atoms/$cm^3$.

The electrode 130 extends, parallel to the direction X, from a proximal end 32 to a distal end 31 going via a bridge 33. The electrode 130 also extends in the direction Y. The thicknesses of the ends 31 and 32 are equal to the thicknesses, respectively, of the ends 11 and 12. The thickness of the bridge 33 is equal to the thickness of the bridge 13. The proximal end 32 comprises a vertical face which is in direct contact with a vertical face of the proximal end 12 so as to form the PN junction.

With respect to a vertical plane parallel to the directions Y and Z and going through the PN junction, the distal ends 11 and 31 are the ends furthest from this plane.

The ends 12 and 32 are shaped so that their juxtaposition forms a waveguide capable of guiding, in the direction Y, the optical signal generated by the laser source 7. This waveguide is typically optically connected to the laser source 7 by means of other waveguides and other couplers structured in the layer 3. In order to simplify FIG. 1, these other waveguides and other couplers have not been shown.

The modulator 100 also comprises two contact points 21 and 22, in direct mechanical and electrical contact with, respectively, the distal ends 11 and 31. These points 21 and 22 are connected to a voltage source controllable as a function of the bit or bits of information to be transmitted by the chip 5.

Typically, the laser source 7 is a DBR ("Distributed Bragg Reflector") laser or DFB ("Distributed FeedBack") laser. Such a laser source is well known and only the details needed for the understanding of the invention are described here. For example, for general details and the operation of such a laser source, the reader may refer to the following articles:

B. Ben Bakir et al., "Hybrid Si/III-V lasers with adiabatic coupling", 2011.

B. Ben Bakir, C. Sciancalepore, A. Descos, H. Duprez, D. Bordel, L. Sanchez, C. Jany, K. Hassan, P. Brianceau, V. Carron, and S. Menezo, "*Heterogeneously Integrated III-V on Silicon Lasers*", Invited Talk ECS 2014.

In order to simplify FIG. 1 and the following figures, only a hybrid laser waveguide 200, 220 of the laser source 7 is shown.

The hybrid laser waveguide 200, 220 is composed of a waveguide 200 made of a III-V gain material and of a silicon waveguide 220. Generally, the waveguide 200 is used for generating and amplifying an optical signal inside an optical cavity of the laser source 7. Here, for this purpose, it is formed within a layer 36 comprising a III-V gain material encapsulated in a dielectric material 136. For example, the material 136 is silicon dioxide or silicon nitride. This layer 36 extends horizontally directly over the layer 20 of dielectric material.

Within the layer 36, the III-V gain material extends vertically from a lower horizontal plane $P_{1inf}$ up to a higher horizontal plane $P_{1sup}$. The plane $P_{1inf}$ is situated at the interface between the layers 20 and 36. The plane $P_{2sup}$ is situated under the upper face of the layer 36. Thus, the III-V gain material of the layer 36 is also mechanically and electrically isolated from the upper face of the layer 36.

The guide 200 typically comprises a doped lower strip 238, a stack 240 of quantum wells or quantum dots of a quaternary alloy and an upper strip 242 doped with a dopant of sign opposite to that of the strip 238. The strips 238 and 242 here are for example made of a N- or P-doped single-crystal InP alloy. In this case, the stack 240 is, for example, a stack of an alternation of sub-layers of InGaAsP or of AlGaInAs or of another material.

The waveguide 200 also comprises:
  contact points 243G and 243D in direct mechanical and electrical contact with the strip 238 and situated, respectively, to the left and to the right of the stack 240, and
  a contact point 244 in direct mechanical and electrical contact with the strip 242.

These points 243G, 243D and 244 allow an electrical current to be injected into the guide 200 between the points 243G, 243D and the point 244.

The guide 220 extends under the guide 200. It is separated from the guide 200 by the layer 20 of dielectric material. The guide 220 is entirely situated inside of the layer 3 and here extends from the plane $P_{2inf}$ up to the plane $P_{2sup}$. In FIG. 1, the guide 220 is shown, by way of illustration, in the case where the direction of propagation of the optical signal inside this waveguide is parallel to the direction Y.

Here, the guide 220 adopts a configuration known by the expression "RIB waveguide". Thus, in the transverse cross-section of this waveguide, parallel to the plane XZ, it comprises a strip 222 and a slab 223. The lower horizontal face of the slab 223 extends in the plane $P_{2inf}$. The upper horizontal face of the strip 222 extends in the plane $P_{2sup}$. Accordingly, the total thickness $e_{220}$ of the guide 220 is equal to the thickness $e_{12}$ of the electrodes of the modulator 100. The strip 222 forms a protrusion on the upper face of the slab 223. Thus, its width is less than the width of the slab 223. The lower horizontal face of the strip 222 and the horizontal upper face of the slab 223 are both contained in an intermediate horizontal plane situated between the planes $P_{2inf}$ and $P_{2sup}$. For example, here, the thickness of the slab 223 is 150 nm and the thickness of the strip 222 is 160 nm.

The guide 220 is optically connected to the guide 200 via at least one optical coupler. This optical coupler transfers, through the layer 20, K % of the power of the optical signal which is propagating in the guide 200 towards the guide 220 and vice-versa. Typically, the coefficient K is greater than or equal to 50% and, here, greater than 80% or 90%. For example, in this embodiment, the laser source 7 comprises first and second optical couplers. In one direction of propagation of the optical signal, the first optical coupler transfers the optical signal from a first part of the guide 220 to the guide 200 and the second optical coupler transfers the optical signal from the waveguide 200 to a second part of the guide 220. These two optical couplers are, for example, structurally identical. Thus, in the following, only one of these optical couplers is described in detail.

In this embodiment, the optical coupler implements an adiabatic coupling between the guides 200 and 220. For a detailed description of an adiabatic coupling, the reader can refer to the following article: Amnon Yariv et al., "Super-mode Si/III-V hybrid Lasers, optical amplifiers and modulators: proposal and analysis", Optics Express 9147, vol. 14, No. 15, 23 Jul. 2007. Such an adiabatic coupling is advantageous in that it is not necessary to form a pointed termination in the III-V gain material in order to ensure a good exchange of optical power between the guides 200 and 220, and also to reduce the coupling length. These pointed terminations are known by the term "tapers".

In order to obtain such an adiabatic coupling between the guides 200 and 220, the thickness $e_{20}$ of the layer 20 is chosen to be greater than 20 nm and, typically, in the range between 20 nm and 250 nm or between 20 nm and 150 nm or between 20 nm and 80 nm. By way of illustration, here, the thickness $e_{20}$ is equal to 100 nm.

One possible operation of the chip 5 is the following. The laser source 7 generates an optical signal. At least a part of this optical signal is directed towards a Mach-Zehnder interferometer, at least one of the branches of which comprises the modulator 100. This part of optical signal is therefore guided by the modulator 100 prior to being recombined with another part of the optical signal guided by the other branch of the Mach-Zehnder interferometer in order to form the modulated optical signal.

Figure 2:
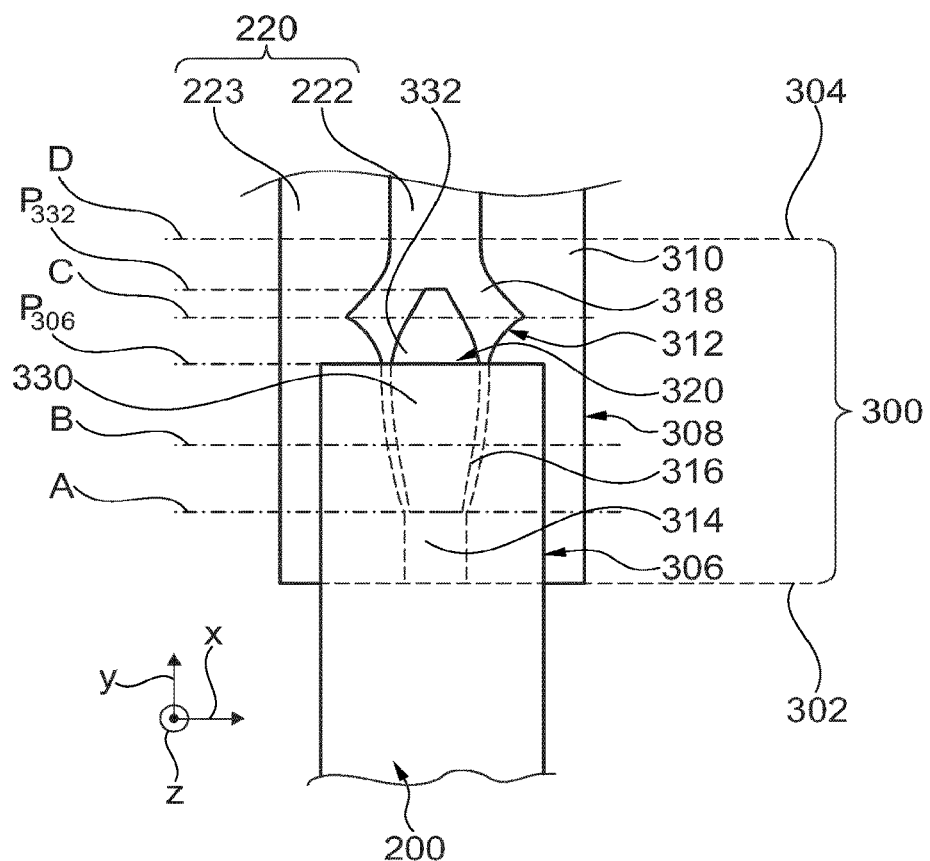
FIG. 2 is a schematic illustration, as a top view, of an optical coupler between a silicon waveguide and a waveguide made of III-V gain material, this optical coupler being implemented in the photonic chip in FIG. 1.
Figure 3:
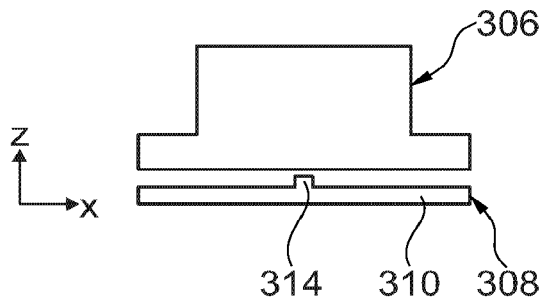
FIGS. 3 to 6 are schematic illustrations of various transverse cross-sections of the optical coupler in FIG. 2.
Figure 4:
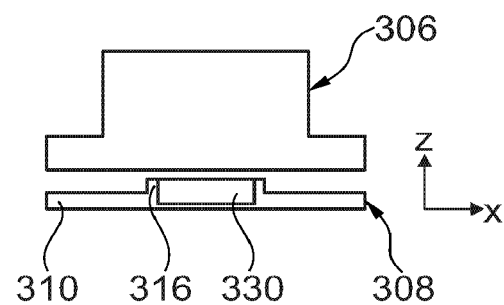
Figure 5:
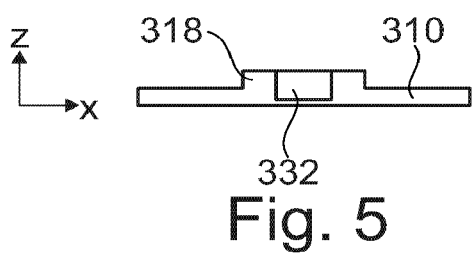
Figure 6:
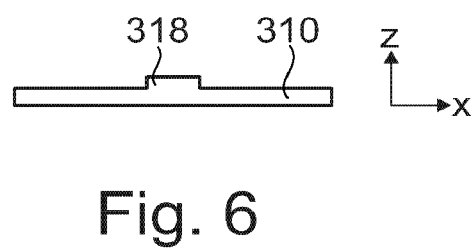

FIG. 2 shows, as a top view, a portion of the guides 200 and 220 and an optical coupler 300 which optically connects these two waveguides through the layer 20. In this FIG. 2, only the cores of the guides 200 and 220 are shown. The claddings of the waveguides are not shown. In the following, the coupler 300 is described in the particular case where the optical signal is propagating from the guide 200 towards the guide 220 and hence in the direction Y. However, this coupler 300 is bidirectional, in other words, it also allows an optical signal to be transferred from the guide 220 towards the guide 200.

In FIG. 2, the elements visible by transparency through an extension 306 are shown with dashed lines. In this figure, the dashed lines A to D represent the positions, respectively, of vertical cross-sectional planes A to D. The transverse cross-sections of the coupler 300 corresponding to the cross-sectional planes A to D are shown, respectively, in FIGS. 3 to 6.

Figure 7:
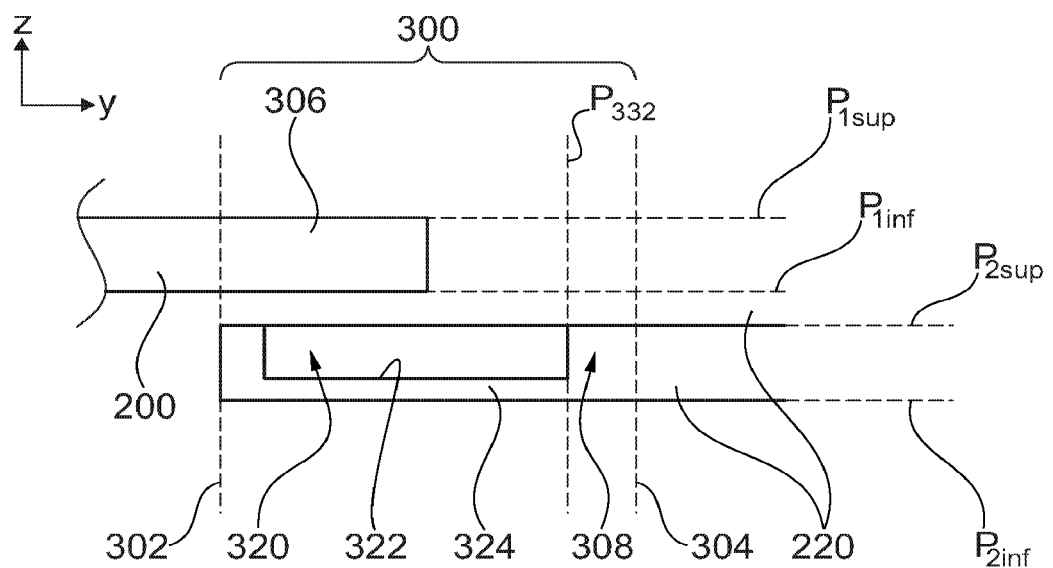
FIG. 7 is a schematic illustration, as a longitudinal cross-section, of the optical coupler in FIG. 2.

FIG. 7 shows the coupler 300 in a transverse cross-section, in other words a cross-section along a vertical plane parallel to the directions Y and Z and going through the centre of the coupler 300.

In FIGS. 3 to 7, only the elements made of silicon, of III-V gain material and of SiGe alloy are shown. The dielectric materials are not shown.

The coupler 300 transfers the optical signal from the waveguide of 200 towards the waveguide of 220 inside a coupling region. In FIGS. 2 and 7, the limits 302 and 304 represent, respectively, the start and the end of this coupling region. Before the limit 302 and after the limit 304, there is no longer any transfer of optical signal between the two guides 200 and 220.

In this text, the guides 200 and 220 stop, respectively, at the limits 302 and 304 and their extensions within the coupling region are considered as forming part of the coupler 300. Thus, the coupler 300 comprises:
  an extension 306 made of III-V gain material which extends the guide 200 within the coupling region and which forms only a single block of material with the guide 200;

a silicon extension 308 which extends the guide 220 within the coupling region and which forms only a single block of material with this guide 220.

The extension 306 is entirely situated between the planes $P_{1inf}$ and $P_{1sup}$. The extension 306 extends continuously from the plane $P_{1inf}$ up to the plane $P_{1sup}$. In this embodiment, the transverse cross-section of the extension 306 is constant and identical to the transverse cross-section of the guide 200. The extension 306 stops abruptly at a vertical plane $P_{306}$ beyond which the extension 306 no longer exists. The plane $P_{306}$ is perpendicular to the direction Y and here situated between the planes B and C. In this embodiment, the extension 306 does not comprise any pointed termination.

The extension 308 is entirely situated between the planes $P_{2inf}$ and $P_{2sup}$. This extension 308 comprises:
 a slab 310 situated in the extension of the slab 223, and
 a strip 312 situated in the extension of the strip 222.

Here, the slab 310 and the strip 312 extend from the limit 304 up to the limit 302. In this exemplary embodiment, the extension 308 stops abruptly at the limit 302 and no longer exists beyond this point.

The lower face of the slab 310 is contained within the plane $P_{2inf}$. Its transverse cross-section is identical to the transverse cross-section of the slab 223. Its upper face is therefore included between the planes $P_{2inf}$ and $P_{2sup}$.

The strip 312 extends from the upper face of the slab 310 up to the plane $P_{2sup}$. At the limit 304, its transverse cross-section is identical to that of the strip 222. Here, at the limit 302, its transverse cross-section is smaller. More precisely, in this exemplary embodiment, moving in the direction Y, the strip 312 comprises, one immediately following the other:
 a parallelepipedic portion 314 of constant transverse cross-section which extends continuously from the limit 302 up to the plane A,
 a portion 316 in which the width of the strip 312 increases continuously and progressively from the plane A up to the plane C, and
 a portion 318 in which the width of the strip 312 decreases continuously and progressively from the plane C up to the limit 304.

Here, the width of the portion 314 is, for example, 1.2 times or 1.5 times smaller than the width of the strip 222.

The coupler 300 also comprises a SiGe inclusion 320 buried inside the extension 308. More precisely, the inclusion 320 is accommodated inside of a recess 322 (FIG. 7) formed in the extension 308.

The recess 322 does not pass through. Thus, under the inclusion 320, a thin silicon base layer 324 (FIG. 7) subsists. In this embodiment, all the vertical walls of this recess 322 are sunk into the portions 316 and 318 of the strip 312 and into the slab 310. Thus, the vertical walls of the recess 322 are made of single-crystal silicon.

Here, the inclusion 320 entirely fills the recess 322 up to the plane $P_{2sup}$. The vertical sides of the inclusion 320 are in direct mechanical contact with the vertical walls of the recess 322.

The inclusion 320 is entirely situated between the planes $P_{2inf}$ and $P_{2sup}$. Here, the upper face of the inclusion 320 is contained within the plane $P_{2sup}$. Its lower face is situated above the plane $P_{2inf}$ and separated from the plane $P_{2inf}$ by the base layer 324. The inclusion 320 comprises two terminations 330 and 332 situated one after the other in the direction Y.

The termination 330 is shaped for transferring, by adiabatic coupling, the optical signal propagating in the extension 306 towards the inclusion 320. For this purpose, the termination 330 is a pointed termination which extends here from the plane A up to the plane $P_{306}$. The width of the termination 330 increases progressively and continuously from a minimum width $L_{min330}$ at the plane A up to a maximum width $L_{max330}$ at the plane $P_{306}$.

The width $L_{min330}$ is chosen such that the effective propagation index of the termination 330 at the plane A is lower than $0.9\,n_{eff306}$ and, preferably, lower than $0.7\,n_{eff306}$, where the index $n_{eff306}$ is the effective propagation index of the extension 306. Here, the index $n_{eff306}$ is constant over the whole length of the extension 306 between the limit 302 and the plane $P_{306}$.

The width $L_{max330}$ is chosen such that the effective propagation index of the termination 330 at the plane $P_{306}$ is higher than $1.1\,n_{eff306}$ and, preferably, higher than $1.4\,n_{eff306}$.

Thus, since the width of the termination 330 increases progressively going in the direction Y, there necessarily exists a particular region of the termination 330, situated between the planes A and $P_{306}$, where the effective propagation index of this termination is equal to the index $n_{eff306}$. It is the presence of this particular region and of a corresponding opposing region of the extension 306 which enables the transfer of the optical signal from the extension 306 to the inclusion 320.

The termination 332 is shaped for transferring the optical signal from the inclusion 320 to the extension 308. For this purpose, in this embodiment, the termination 332 is also a pointed termination. The termination 332 extends from the plane $P_{306}$ up to a vertical plane $P_{332}$. The plane $P_{332}$ is perpendicular to the direction Y and situated between the planes C and D. The width of the termination 332 decreases progressively and continuously, going in the direction Y, from a maximum width $L_{max332}$, at the plane $P_{306}$, down to a minimum width $L_{min332}$ at the plane $P_{332}$.

The maximum width $L_{max332}$ here is equal to the width $L_{max330}$.

The width $L_{min332}$ is chosen such that the effective propagation index of the termination 332 at the plane $P_{332}$ is lower than $0.9\,n_{eff220}$ and, preferably, lower than $0.7\,n_{eff220}$, where the index $n_{eff220}$ is the effective propagation index of the guide 220. The index $n_{eff220}$ is lower than the index $n_{eff306}$. As a consequence, the effective propagation index of the termination 332 at the plane $P_{306}$ is higher than the index $n_{eff220}$. Under these conditions, as for the termination 330, there necessarily exists a particular region of the termination 332 where its effective propagation index is equal to the index $n_{eff220}$. It is mainly in this particular region where the transfer of the optical signal from the inclusion 320 to the extension 308 and hence to the guide 220 takes place.

For the same dimensions, the effective propagation index of a waveguide made of SiGe is higher than the effective propagation index of a silicon waveguide. Accordingly, the presence of the inclusion 320 allows, with reduced dimensions, a region whose effective propagation index is equal to the index $n_{eff306}$ to be obtained.

Furthermore, usually, the SiGe alloys used in the fabrication of optical components, such as photodiodes, exhibit high absorption losses. However, in the framework of an optical coupler, the absorption losses must be limited. Here, in order to obtain both a high effective propagation index and low propagation losses, the inclusion 320 is formed from a SiGe alloy whose chemical formula is $Si_{1-x}Ge_x$, where the coefficient x is in the range between 0.2 and 0.5. The coefficient x is the concentration in atomic percentages of germanium in this alloy, the rest being silicon ignoring the inevitable impurities. The value 1 of the coefficient x corresponds to 100%, whereas the value 0 of this coefficient x corresponds to 0%. Preferably, the coefficient x is chosen between 0.3 and 0.5 and, even more advantageously, between 0.4 and 0.5. In this exemplary embodiment, the coefficient x is equal to 0.4.

Figure 8:
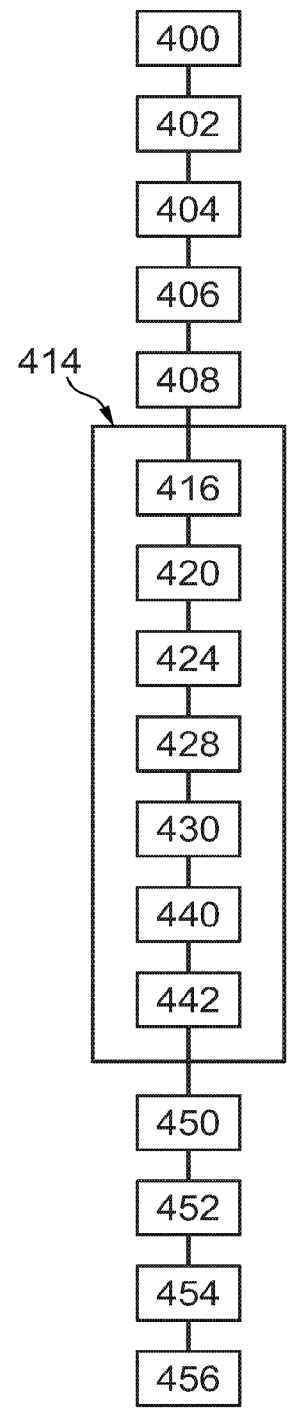
FIG. 8 is a flow diagram of a method of fabrication of the photonic chip in FIG. 1.

The fabrication of the chip 5 will now be described with the aid of the flow diagram in FIG. 8 and with reference to FIGS. 9 to 16. In FIGS. 9 to 16, the substrate 44 has not been shown.

The fabrication of the modulator 100 and waveguides 200 and 220 is well known. Thus, only the steps for fabrication of the coupler 300 are described in more detail.

The method starts with a step 400 for provision of an SOI substrate corresponding to the stacking of the substrate 44, of a buried layer of dielectric material and of a layer of single-crystal silicon. The initial thickness of the layer of single-crystal silicon here is 310 nm. The thickness of the buried layer of dielectric material is greater than 500 nm or 1 µm and, generally, less than 3 µm.

Subsequently, during a step 402, the layer of single-crystal silicon is structured in order to notably form the electrodes 120, 130, the core of the waveguide 220 and the extension 308 without the recess 322.

During a step 404, the electrodes 120 and 130 are doped so as to obtain the various desired regions of doping. Typically, this is implemented by localized doping operations.

During a step 406, the structured layer of single-crystal silicon is encapsulated in the dielectric material 117, then the upper face of the material 117 is polished.

During a step 408, a stopping layer 410 (FIGS. 9 to 16) is deposited on the material 117. This layer 410 is of a dielectric material different from the dielectric material 117. Moreover, here, this layer 410 is formed from a material on which the SiGe alloy cannot grow during an operation for growth of this alloy by vapour-phase epitaxy. For example, the layer 410 is made of silicon nitride. Its thickness is typically greater than or equal to 20 nm and, generally, less than 200 nm. Here, the thickness of the layer 410 is 40 nm.

A transverse cross-section of the extension 308 obtained at the end of the preceding steps is shown in FIG. 9.

At this stage, during a step 414, the inclusion 320 is formed in the extension 308. The formation of the inclusion 320 comprises, successively, the following operations.

During an operation 416, a layer 418 (FIG. 10) of photosensitive resin (photoresist) is deposited on the upper face of the layer 410.

During an operation 420, an opening 422 (FIG. 11) which passes right through the thickness of the layer 418 of photoresist is designed to expose the portion of the upper face of the layer 410 to be etched. The horizontal cross-section of the opening 422 is identical to the horizontal cross-section of the inclusion 320 to be fabricated.

During an operation 424, the layer 410 is etched through the opening 422 in order to obtain a cavity 426 (FIG. 12) which emerges directly on the upper face of the extension 308.

During an operation 428, the layer 418 of photoresist is removed (FIG. 13).

During an operation 430, the cavity 426 (FIG. 14) is extended, in the vertical direction, inside the extension 308 so as to form the recess 322. During this operation 430, the layer 410 is used as a mask, in other words the extension 308 is etched through the layer 410. The etching of the extension 308 is interrupted before reaching the dielectric material 117 such that there subsists a thin layer of silicon of at least 30 nm thickness between the bottom of the recess 322 and the dielectric material 117. Here, the thickness of this thin layer is equal to 50 nm. This thin layer therefore forms the silicon base layer 324.

During an operation 440, the recess 322 is filled with SiGe alloy of chemical formula identical to that of the inclusion 320. For this purpose, an operation for vapour-phase epitaxial growth of the SiGe alloy on the base layer 324 is implemented. This operation is interrupted once the recess 322 is entirely filled by the SiGe alloy. The inclusion 320 is thus formed. At this stage, as shown in FIG. 15, the upper face of the inclusion 320 is dished outwards.

During an operation 442, the upper face of the inclusion 320 is polished. For example, a chemical-mechanical polishing or CMP is implemented in order to remove the thickness of SiGe alloy which protrudes beyond the recess 322 without however removing the thickness of SiGe accommodated inside of this recess. During this CMP polishing, the layer 410 is used as a stopping layer for the polishing. Following this operation, the upper face of the inclusion 320 is plane and coincident with the upper face of the layer 410 (FIG. 16). At this stage, the formation of the inclusion 320 is finished.

Subsequently, during a step 450, the layer 20 is deposited onto the polished face.

During a step 452, a substrate or a wafer made of III-V gain material is transferred, by direct bonding, onto the layer 20 then structured so as to form the guide 200 and the extension 306.

Subsequently, during a step 454, the guide 200 and the extension 306 are encapsulated in the dielectric material 136.

Finally, during a step 456, the contact points 21, 22, 243D, 243G and 244 are formed.

Chapter II: Variants

Variants of the Inclusion

As a variant, the extension 306 also comprises a pointed termination, such that for example the width of the extension 306 decreases progressively and continuously going in the direction Y.

In another embodiment, the extension 306 continues beyond the plane $P_{306}$ with a curved part. This curved part runs further away from the extension 308. Thus, beyond the plane $P_{306}$, the extension 306 is no longer situated above the extension 308, which avoids any transfer of power between this curved part and the extension 308.

As a variant, the extension 308 continues beyond the limit 302 with a portion of the waveguide 220 capable of guiding the part of the optical signal which has not been transferred, by the coupler 300, to the guide 200 when the signal is propagating in the opposite direction to the direction Y.

In another embodiment, the width of the portion 314 of the strip 312 is equal to the width of the strip 222 of the guide 220.

In simplified embodiments, the portion 314 and/or the portion 316 of the strip 312 are omitted.

As a variant, the plane $P_{306}$ and the plane C are coincident. In this case, the portion 318 of the strip 312 and the termination 332 of the inclusion 320 start in the same plane.

As a variant, the inclusion 320 does not fill the recess 322 over its whole height. In this case, the upper face of the inclusion 320 is situated below the plane $P_{2sup}$. The space between the upper face of the inclusion 320 and this plane $P_{2sup}$ is then filled with dielectric materials such as, for example, the material 117. In this case, the upper face of the inclusion 320 can remain dished outwards, because it is not polished during the operation 442.

As a variant, one or more thin interface layers are deposited on the base layer 324 before growing the SiGe alloy by epitaxy. This or these thin interface layers are typically lattice parameter adaptation layers whose function is to limit the appearance of dislocations in the SiGe alloy deposited during the epitaxial growth. The total thickness of this or of these thin interface layers is generally less than 10% of the thickness of the inclusion 320. In this case, the inclusion 320 is not directly deposited on the silicon base layer 324.

The upper face of the inclusion 320 may be covered with one or more thin passivation layers.

The optical coupling between the termination 330 and the extension 306 may be implemented differently. For example, as a variant, the termination 330 is optically coupled to the extension 306 by a directional or evanescent coupling. In this case, the width of the termination 330 is for example constant between the plane A and the plane $P_{306}$. This width is then chosen such that the effective propagation index of the termination 330 is equal to the index $n_{eff306}$ over its whole region included between the plane A and the plane $P_{306}$. In this case, the termination 330 is not therefore a pointed termination. In addition, in this case, it is the length of the termination 330 and the constant distance separating it from the extension 306 which are adjusted in order to transfer the desired quantity of the optical signal from the inclusion 320 to the guide 200 and vice versa.

Other embodiments of the termination 332 are possible. For example, as a variant, the termination 332 is not a pointed termination. In this case, the width of the termination 332 is constant over its whole length. The width of the termination 332 is then chosen such that, at its distal end, its effective propagation index is equal to the index $n_{eff220}$. Under these conditions, the majority of the optical signal which goes from the inclusion 320 to the extension 308 goes through a vertical side of the inclusion 320 contained in the plane C. This type of optical coupling is known by the term "butt coupling".

At the distal ends of the terminations 330 and 332, the width of the termination in question may be smaller or larger than what has been shown. In one particular case, the width of the termination at its distal end is virtually zero, in other words very small and, for example, less than 10 nm.

As a variant, the portions 316 and 318 which cover the upper parts of the lateral sides of the inclusion 320 are omitted. When the portion 318 is omitted, the termination 332 is extended up to the strip 222. Thus, in this case, the plane $P_{332}$ is coincident with the plane D.

As a variant, the inclusion 320 comprises a portion of constant transverse cross-section situated between the terminations 330 and 332.

As a variant, beyond the plane $P_{332}$, the coupler 300 comprises patterns aligned one behind the other in the direction Y of propagation of the optical signal at the wavelength $\lambda_{Li}$. Each pattern is made of SiGe and entirely encapsulated in the extension 308. The horizontal dimensions of these patterns are smaller than the wavelength $\lambda_{Li}$. In addition, the length of these patterns in the direction Y decreases the further it is from the plane $P_{332}$. The transverse cross-section of each pattern is for example rectangular.

Variants of the Method of Fabrication

Other methods of fabrication of the coupler 300 are possible. For example, in the case where the portions 316 and 318 of the strip 312 are omitted, a substantial part of the vertical walls of the recess 322 are made of the material 117 rather than silicon. In this case, if the thickness of the slab 310 fabricated during the step 402 is sufficiently small, in other words less than 100 nm or 60 nm, it is not necessary to thin this slab 310 in order to obtain the base layer 324. The operation 430 for etching the slab 310 may therefore be omitted. In this case, the cavity 426 obtained following the operation 424 directly constitutes the desired recess 322.

In another embodiment, the layer 410 above the extension 306 is omitted and it is the same mask formed in the photoresist layer 418 which is used to etch out the cavity 426 then the recess 322.

As a variant, after the step 450 for deposition of a thin layer of dielectric material, a substrate, for example identical to the substrate 44, is bonded onto this thin layer. The chip 5 in the process of being fabricated is then turned over, then the substrate 44 is removed. The layer 3 could be thinned so as to only leave a thin thickness of the material 117. This thin thickness of the material 117 then forms the layer 20. Subsequently, the steps 452, 454 and 456 are executed on the upper face of the layer 20 thus formed. In this variant, the operation 450 allows the thickness of the material 117 which is situated between the plane $P_{2inf}$ and the upper face of the substrate to be obtained.

In the variant hereinabove, the contact points 21 and 22 may each be formed in two parts. For this purpose, a first part of each of these contact points is formed in the substrate which is mounted by bonding and prior to the inversion of the chip 5. Each first part thus extends from a respective electrode of the modulator 100 to a respective electrical track formed on the external face of the substrate mounted by bonding. Subsequently, during the step 456, the second part of the contact points 21 and 22 is formed. This second part passes completely through the layers 36 and 3, and the substrate mounted by bonding, so as to reach the electrical tracks which form, at this stage, the lower ends of the first parts of these contact points.

Other Variants

As a variant, only a part of the optical signal is transferred from the guide 200 to the guide 220 and vice versa. In this case, generally, the waveguide in which a part of the optical signal remains then extends beyond the coupling region so as to continue guiding this part of the optical signal which has not been transferred to the other waveguide.

Other configurations of the waveguide 220 are possible. For example, as a variant, the width of the strip 222 is equal to the width of the slab 223. In this case, the configuration of the waveguide 220 is known by the term "strip waveguide". In another embodiment, the width of the strip 222 is greater than the width of the slab 223. In this case, the configuration of the waveguide 220 is still a strip waveguide but the positions of the strip and of the slab are reversed with respect to the embodiment in FIG. 1.

Other embodiments of the modulator 100 are possible. For example, the modulator may be replaced by a PiN (Positive intrinsic Negative) junction modulator in which the P and N doped electrodes are separated by an undoped semiconductor region called "intrinsic semiconductor". The doped regions may also be separated by a thin layer of dielectric material such as silicon oxide. In the latter case, the electrode 130 may be situated between the planes $P_{1inf}$ and $P_{1sup}$ such that its proximal end 32 is separated from the proximal end 12 by the layer 20 of dielectric material.

The bridges 13 and 33 may be omitted.

Other III-V gain materials are possible for forming the laser source 7. For example, the guide 200 is formed from the following stack going from bottom to top:
- a lower sub-layer of N-doped GaAs,
- quantum dot sub-layers of AlGaAs, or AlGaAs quantum wells, and
- an upper sub-layer of P-doped GaAs.

Other dielectric materials are possible for the materials 117 and 136 and the layer 20. For example, the materials may be silicon nitride, aluminium nitride, an electrically-insulating polymer, $Al_2O_3$.

As a variant, a part or the entirety of the contact points are formed, rather than through the material 136, through the substrate 44. In this case, with respect to what has been shown in the preceding figures, one or more electrical contact points emerge under the substrate 44.

The substrate 44 may be composed of a material other than silicon.

As a variant, the guides 200, 220 are curved. In this case, the shaping of the various elements optically coupled to these waveguides is adapted to the radius of curvature of these waveguides.

What has been described here is also applicable to the case where the silicon waveguide and the waveguide made of III-V material are not waveguides of a laser source. In the latter case, the waveguide made of III-V material may be formed from a III-V material which is not necessarily a gain material.

Chapter IV-Advantages of the Embodiments Described

For the same dimensions, the inclusion 320 has an effective propagation index higher than the effective propagation index of silicon. Accordingly, the transverse dimensions of the inclusion which allow an effective propagation index to be obtained equal to $n_{eff306}$ are much smaller than if only silicon were used. Moreover, this inclusion is formed in a recess of the extension 308. It is therefore buried inside of this extension 308. Under these conditions, the inclusion 320 allows an effective propagation index to be achieved equal to the index $n_{eff306}$ without the height of this inclusion exceeding the plane $P_{2sup}$. Thus, by virtue of this inclusion 320, it is not necessary to produce, on the extension 308, an extra thickness of silicon in order to obtain an effective propagation index equal to the index $n_{eff306}$. Accordingly, the size of the optical coupler 300 is reduced with respect to the case where the inclusion 320 is not used.

Furthermore, the inclusion 320 is made of a SiGe alloy in which the germanium concentration is in the range between 20 and 50 atomic %, in other words in a range of concentration where the absorption losses inside of the SiGe alloy are low and practically equal to the absorption losses of a silicon waveguide. Thus, the inclusion 320 allows the size of the optical coupler to be reduced without substantially increasing the optical losses.

Disposing the inclusion 320 on the silicon base layer 324 allows the number of dislocations appearing during the fabrication of the inclusion 320 to be limited and hence the absorption losses in the inclusion 320 to be limited even more.

The pointed termination 330 allows an adiabatic coupling between the inclusion 320 and the extension 306 to be obtained. Such an adiabatic coupling is shorter than the other possible optical couplings. This therefore allows the size of the optical coupler 300 to be further reduced. In addition, such an adiabatic coupling allows a larger bandwidth to be obtained than with other optical coupling technologies.

The pointed termination 332, whose vertical sides are directly in contact with the vertical walls of the recess 322 formed in the extension 308, allows the inclusion 320 to be optically coupled to the extension 308 while at the same time using an inclusion 320 which is entirely situated between the planes $P_{2inf}$ and $P_{2sup}$. This therefore allows the size of the optical coupler to be reduced even further.

The invention claimed is:

1. A photonic chip comprising:
   - a substrate which mainly extends in a plane called "plane of the substrate",
   - a first waveguide which mainly extends parallel to the plane of the substrate and whose core is made of a III-V material,
   - a second waveguide which mainly extends parallel to the plane of the substrate and whose core is made of silicon,
   - an optical coupler capable of transferring, between a start and an end of a coupling region, at least a part of an optical signal which is propagating, at the start of the coupling region, in one of the first and second waveguides towards the other of the first and second waveguides, said optical coupler comprising for said purpose:
     - a first extension made of III-V material which extends the core of the first waveguide into the coupling region,
     - a second extension made of silicon which extends the core of the second waveguide into the coupling region, said second extension runs facing the first extension,
   - wherein the optical coupler comprises a SiGe inclusion buried inside of the second extension, said inclusion:
     - being made of SiGe whose chemical formula is $Si_{1-x}Ge_x$, where x is in the range between 0.2 and 0.5, and
     - being optically coupled, on a first side, to the first waveguide and, on a second opposing side, to the second waveguide.

2. The chip according to claim 1, wherein the inclusion is accommodated within a recess formed in the second extension, a bottom of said recess being formed by a silicon base layer whose thickness is less than a thickness of the second waveguide and on which the SiGe inclusion is formed.

3. The chip according to claim 1, wherein:
   - the first waveguide and the first extension are entirely situated between first lower and upper planes parallel to the plane of the substrate, the first waveguide having lower and upper faces contained, respectively, in the first lower and upper planes,
   - the second waveguide and the second extension are entirely situated between second lower and upper planes parallel to the plane of the substrate, the second waveguide having lower and upper faces contained, respectively, in the second lower and upper planes,
   - the first and second lower and upper planes are stacked one on top of the other in the following order: the second lower plane, the second upper plane, the first lower plane then the first upper plane, and
   - the inclusion is entirely situated between the second lower and upper planes.

4. The chip according to claim 3, wherein:
   - on the first side, the inclusion comprises a first pointed termination which optically connects the inclusion to the first waveguide, a width of said first termination decreasing progressively and continuously from a maximum width down to a minimum width going in a direction of the first waveguide, the width of the first termination being measured in a direction parallel to the plane of the substrate and perpendicular to a direction of propagation of the optical signal in said first termination, an effective propagation index of said first termination at a location where its width is maximum is greater than an effective propagation index of a portion of the first extension situated facing said location of the first termination where its width is maximum, and an effective propagation index of said first termination at a location where its width is minimum is less than an effective propagation index of a portion of the first extension situated facing said location of the first termination where its width is minimum.

5. The chip according to claim 1, wherein:

on the second side, the inclusion comprises a second pointed termination which optically connects the inclusion to the second waveguide, a width of said second termination decreasing progressively and continuously from a maximum width down to a minimum width going in a direction of the second waveguide, vertical sides of said second termination being in direct contact with vertical walls of a recess formed in the second extension, these vertical sides and these vertical walls each extending mainly in a plane perpendicular to the plane of the substrate, the width of the second termination being measured in a direction parallel to the plane of the substrate and perpendicular to a direction of propagation of the optical signal in said second termination, an effective propagation index of said second termination at a location where its width is maximum is greater than an effective propagation index of the second waveguide, and an effective propagation index of said second termination at a location where its width is minimum is less than the effective propagation index of the second waveguide.

6. The chip according to claim 3, wherein a distance which separates the second lower plane from the second upper plane is less than or equal to 310 nm.

7. The chip according to claim 1, wherein the inclusion is made of SiGe whose chemical formula is $Si_{1-x}Ge_x$, where x is in the range between 0.4 and 0.5.

8. The chip according to claim 1, wherein:

the first waveguide is made of III-V gain material, and the chip comprises:

a semiconductor laser source capable of generating the optical signal, said laser source comprising the first waveguide, the second waveguide and the optical coupler which optically connects the first and second waveguides to each other through a layer of dielectric material, and a phase and/or amplitude modulator formed on the same substrate and configured to modulate the optical signal generated by the semiconductor laser source, said modulator comprising:

a first electrode made of P- or N-doped silicon entirely situated between the second lower and upper planes, and a second electrode having a doping of sign opposite to that of the first electrode.

9. The chip according to claim 1, wherein the second waveguide has an effective propagation index less than an effective propagation index of the first waveguide.

10. A method of fabrication of a photonic chip according to claim 1, wherein the method comprises:

providing the substrate which extends mainly in the plane of the substrate, forming the first waveguide which extends mainly parallel to the plane of the substrate forming the second waveguide which extends mainly parallel to the plane of the substrate and whose core is made of silicon, and forming the optical coupler capable of transferring, between the start and the end of the coupling region, at least the part of the optical signal which is propagating, at the start of the coupling region, in one of the first and second waveguides towards the other of the first and second waveguides, wherein forming the optical coupler comprises forming of the SiGe inclusion buried inside the second extension.

11. A method according to claim 10, wherein forming the SiGe inclusion comprises an operation for epitaxial growth of the SiGe inclusion on a silicon base layer.

* * * * *